(12) United States Patent
Furuyama et al.

(10) Patent No.: US 9,044,706 B2
(45) Date of Patent: *Jun. 2, 2015

(54) WATER-PROOF AIR-PERMEABLE FILTER AND USE OF THE SAME

(75) Inventors: Satoru Furuyama, Osaka (JP); Satoshi Sakuma, Osaka (JP); Yozo Nagai, Osaka (JP); Junichi Moriyama, Osaka (JP)

(73) Assignee: Nitto Denko Corporation, Osaka (JP)

(*) Notice: Subject to any disclaimer, the term of this patent is extended or adjusted under 35 U.S.C. 154(b) by 111 days.

This patent is subject to a terminal disclaimer.

(21) Appl. No.: 13/703,543

(22) PCT Filed: Mar. 23, 2011

(86) PCT No.: PCT/JP2011/001700
§ 371 (c)(1),
(2), (4) Date: Dec. 11, 2012

(87) PCT Pub. No.: WO2011/158409
PCT Pub. Date: Dec. 22, 2011

(65) Prior Publication Data
US 2013/0087042 A1 Apr. 11, 2013

(30) Foreign Application Priority Data
Jun. 16, 2010 (JP) ................. 2010-136829

(51) Int. Cl.
*B01D 53/22* (2006.01)
*B01D 53/26* (2006.01)
(Continued)

(52) U.S. Cl.
CPC .......... *B01D 53/268* (2013.01); *B01D 39/1692* (2013.01); *B01D 65/003* (2013.01); *B01D 2313/04* (2013.01); *B32B 3/08* (2013.01);
(Continued)

(58) Field of Classification Search
USPC ................. 95/43, 45, 46, 47, 54; 96/4, 6
See application file for complete search history.

(56) References Cited

U.S. PATENT DOCUMENTS 4,161,948 A * 7/1979 Bichon .......................... 602/58
4,459,139 A * 7/1984 vonReis et al. ................. 96/6
(Continued)

FOREIGN PATENT DOCUMENTS

JP 57-160617 10/1982
JP 60-038723 U 3/1985
(Continued)

OTHER PUBLICATIONS

Machine Translation JP 09132667 May 20, 1997 Haruo.*
(Continued)

*Primary Examiner* — Jason M Greene
*Assistant Examiner* — Anthony Shumate
(74) *Attorney, Agent, or Firm* — Hamre, Schumann, Mueller & Larson, P.C.

(57) ABSTRACT

A water-proof air-permeable filter (1) includes: a resin film (2) having formed therein a plurality of through pores (21); a treated layer (3) having hydrophobicity and oil repellency, and formed on at least one of both surfaces in the thickness direction of the resin film (2) such that the treated layer (3) has openings (31) at positions corresponding to the through pores (21); and a loop-shaped double-sided tape (4) stuck to an edge region of one of both surfaces in the thickness direction of the resin film (2), with the treated layer (3) interposed therebetween.

15 Claims, 2 Drawing Sheets

(51) Int. Cl.
- *B01D 39/16* (2006.01)
- *B01D 65/00* (2006.01)
- *B32B 3/08* (2006.01)
- *B32B 3/26* (2006.01)
- *H05K 5/02* (2006.01)
- *B01D 46/54* (2006.01)
- *B01D 69/10* (2006.01)
- *B32B 5/32* (2006.01)
- *H05K 7/20* (2006.01)
- *B01D 67/00* (2006.01)
- *B01D 71/32* (2006.01)

(52) U.S. Cl.
CPC ........... *B32B3/266* (2013.01); *B32B 2307/724* (2013.01); *B32B 2307/7265* (2013.01); *H05K 5/0213* (2013.01); *B01D 39/16* (2013.01); *B01D 46/54* (2013.01); *B01D 69/10* (2013.01); *B32B 5/32* (2013.01); *H05K 7/20* (2013.01); *B01D 67/0088* (2013.01); *B01D 71/32* (2013.01); *B01D 2323/283* (2013.01); *B01D 2325/38* (2013.01)

(56) References Cited

U.S. PATENT DOCUMENTS

| | | | |
|---|---|---|---|
| 4,521,212 A * | 6/1985 | Ruschke | 604/126 |
| 5,069,794 A | 12/1991 | Haag et al. | |
| 5,100,555 A * | 3/1992 | Matson | 95/44 |
| 5,215,554 A | 6/1993 | Kramer et al. | |
| 5,700,375 A | 12/1997 | Hagen et al. | |
| 5,955,175 A * | 9/1999 | Culler | 428/209 |
| 6,015,500 A * | 1/2000 | Zuk, Jr. | 210/767 |
| 6,375,854 B2 * | 4/2002 | Beplate | 210/767 |
| 6,512,834 B1 * | 1/2003 | Banter et al. | 381/386 |
| 6,550,622 B2 * | 4/2003 | Koslow | 210/490 |
| 7,255,725 B2 | 8/2007 | Chau et al. | |
| 8,079,574 B2 * | 12/2011 | Lin | 261/104 |
| 8,523,981 B2 | 9/2013 | Huang et al. | |
| 8,747,521 B2 * | 6/2014 | Sano | 95/47 |
| 2006/0147698 A1 * | 7/2006 | Carroll et al. | 428/316.6 |
| 2010/0024898 A1 * | 2/2010 | Bansal et al. | 137/197 |
| 2012/0114902 A1 * | 5/2012 | Furuyama et al. | 428/137 |
| 2012/0297976 A1 * | 11/2012 | Sano | 95/47 |
| 2013/0074691 A1 * | 3/2013 | Furuyama et al. | 95/45 |
| 2013/0192460 A1 | 8/2013 | Miller et al. | |
| 2013/0296825 A1 * | 11/2013 | Lerner | 604/506 |
| 2013/0333978 A1 | 12/2013 | Abe et al. | |
| 2014/0038171 A1 * | 2/2014 | Metzger et al. | 435/5 |

FOREIGN PATENT DOCUMENTS

| | | |
|---|---|---|
| JP | 2-167700 | 6/1990 |
| JP | 4-154573 | 5/1992 |
| JP | 5-086216 | 4/1993 |
| JP | 9-132667 | 5/1997 |
| JP | 2002-035558 | 2/2002 |
| JP | 2005-179562 | 7/2005 |
| JP | 2005-250268 | 9/2005 |
| JP | 2005-266004 | 9/2005 |
| JP | 2006-075648 | 3/2006 |
| JP | 2008-237949 | 10/2008 |
| JP | 2009-007439 | 1/2009 |
| JP | 2009-051872 | 3/2009 |

OTHER PUBLICATIONS

Machine Translation JP 2005-266004 Mar. 16, 2004 Hiroyuki.*

* cited by examiner

WATER-PROOF AIR-PERMEABLE FILTER AND USE OF THE SAME

This application is a U.S. national stage application of International Patent Application No. PCT/JP2011/001700, filed Mar. 23, 2011.

TECHNICAL FIELD

The present invention relates to a water-proof air-permeable filter to be attached to, for example, a housing, and relates to use of the water-proof air-permeable filter.

BACKGROUND ART

Conventionally, in, for example, automobile electric components such as automobile ECUs (Electrical Control Units), motors, lamps, and sensors, household electric appliances such as electric toothbrushes, shavers, and cellular phones, and solar cells, an opening is provided in a housing that accommodates an electronic component, a control board, etc., in order to eliminate a pressure difference between the inside and outside of the housing, and the opening is covered with a water-proof air-permeable filter. This water-proof air-permeable filter ensures ventilation between the inside and outside of the housing and also prevents foreign matters such as water and dust from entering the housing.

For such a water-proof air-permeable filter, a polytetrafluoroethylene (PTFE) porous membrane having favorable air permeability and high water pressure resistance is commonly used (for example, see Patent Literature 1). Generally, a PTFE porous membrane can be obtained by molding PTFE fine powder into a sheet shape and then stretching the sheet-shaped molded body in two directions orthogonal to each other.

CITATION LIST

Patent Literature

PTL 1: JP 2008-237949 A

SUMMARY OF INVENTION

Technical Problem

In some cases, a water-proof air-permeable filter is stuck to a housing by means of, for example, heat welding, ultrasonic welding, or an adhesive agent. In view of improving work efficiency of the sticking to the housing, a loop-shaped double-sided tape is preferably provided along the edge region of the water-proof air-permeable filter.

However, in the case of a water-proof air-permeable filter using a PTFE porous membrane, if the stretch ratio at the time of producing the PTFE porous membrane is increased, the fiber diameter of the PTFE porous membrane becomes small, which may lead to reduction in the area of adhesion between the PTFE porous membrane and a double-sided tape and thereby lower the strength of adhesion therebetween. In particular, when such a water-proof air-permeable filter is placed in a high-temperature environment, the strength of adhesion between the PTFE porous membrane and the double-sided tape greatly reduces, which may cause entry of water into a housing from the interface between the PTFE porous membrane and the double-sided tape.

In view of the above circumstances, an object of the present invention is to provide a water-proof air-permeable filter that securely holds a double-sided tape, and use of the water-proof air-permeable filter.

Solution to Problem

In order to solve the above problem, the present invention provides a water-proof air-permeable filter for ensuring ventilation and also preventing entry of water, the water-proof air-permeable filter comprising: a non-porous resin film having formed therein a plurality of through pores extending through the resin film in a thickness direction and each having a predetermined size larger than or equal to 0.01 μm and smaller than or equal to 10 μm; a treated layer having hydrophobicity and oil repellency, and formed on at least one of both surfaces in the thickness direction of the resin film such that the treated layer has openings at positions corresponding to the plurality of through pores; and a loop-shaped double-sided tape stuck to an edge region of one of both surfaces in the thickness direction of the resin film, with the treated layer interposed therebetween.

Here, the "size" of the through pore means the diameter of a circle having an area equal to the cross-sectional area of the through pore.

In addition, the present invention provides use of a water-proof air-permeable filter, the use comprising using the above-described water-proof air-permeable filter to cover an opening provided in a housing, and eliminate a pressure difference between the inside and outside of the housing via the water-proof air-permeable filter.

Advantageous Effects of Invention

With the above features, ventilation is allowed by the through pores formed in the resin film, and waterproofness can also be ensured by the treated layer on the resin film. Furthermore, since the non-porous resin film is used, a large area of adhesion between the treated layer formed on the resin film and the double-sided tape can be ensured. Therefore, according to the present invention, the double-sided tape and the treated layer can be adhered to each other with a sufficient adhesion strength, and thus the double-sided tape can be securely held.

DESCRIPTION OF EMBODIMENT

Hereinafter, an embodiment of the present invention will be described with reference to the accompanying drawings.

Figure 1:
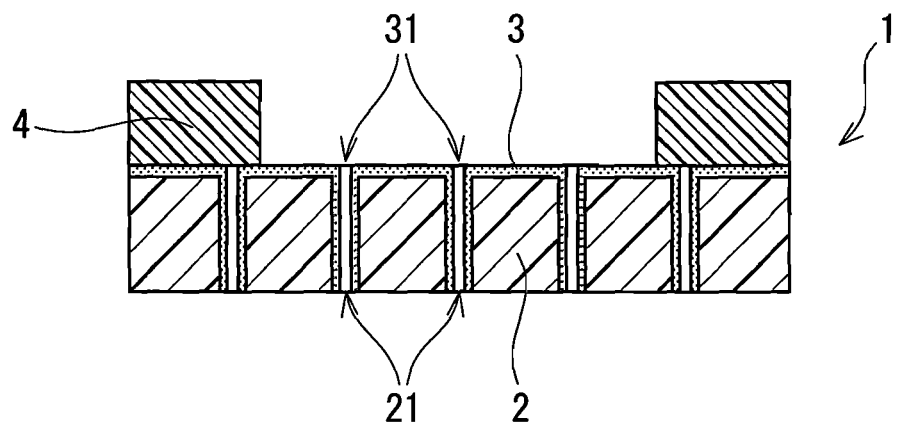
FIG. 1 is a schematic cross-sectional view of a waterproof air-permeable filter according to one embodiment of the present invention.

FIG. 1 shows a water-proof air-permeable filter 1 according to an embodiment of the present invention. The water-proof air-permeable filter 1 is for ensuring ventilation and also preventing entry of water. For example, the water-proof air-permeable filter 1 is attached to a housing (not shown) so as to cover an opening provided in the housing, and is used for eliminating a pressure difference between the inside and outside of the housing via the water-proof air-permeable filter 1.

Specifically, the water-proof air-permeable filter 1 includes a non-porous resin film 2, a treated layer 3 formed on the resin film 2, and a loop-shaped double-sided tape 4 provided along the edge region of the resin film 2. As used herein, the term "non-porous" means having a solid inside that is filled with a resin.

The shape of the resin film 2 is not particularly limited. For example, the resin film 2 may be circular or polygonal in a plan view (when viewed in the thickness direction).

In the resin film 2, a plurality of through pores 21 extending through the resin film 2 in the thickness direction are formed. In other words, the through pores 21 are open at both surfaces in the thickness direction of the resin film 2. Typically, the through pores 21 are straight pores having a given cross-sectional shape and extending linearly through the resin film 2. Such through pores can be formed by, for example, ion beam irradiation and etching. By use of ion beam irradiation and etching, through pores that have uniform sizes and axial directions can be formed in the resin film 2.

The cross-sectional shape of the through pores 21 is not particularly limited, and may be circular, or may be an undefined shape. In addition, the axial directions of the through pores 21 need not be a direction perpendicular to both surfaces in the thickness direction of the resin film 2, and may tilt relative to the direction.

The through pores 21 each have a predetermined size greater than or equal to 0.01 μm and smaller than or equal to 10 μm The sizes of the through pores 21 need not be exactly the same among all the through pores 21, and it is sufficient that the through pores 21 have such sizes as can be considered to be substantially the same among all the through pores 21 (for example, the standard deviation is 10% or less of the average value). The sizes of the through pores 21 can be adjusted by etching time or the concentration of an etching treatment liquid. Preferably, the size of each through pore 21 is 0.5 μm or more and 5 μm or less.

Preferably, the through pores 21 are uniformly distributed over the entire resin film 2 such that the density of the through pores 21 falls within specific limits included in a range from 10 to $1 \times 10^8$ pores/mm$^2$ (for example, such that the maximum density is smaller than or equal to 1.5 times of the minimum density). The density of the through pores 21 can be adjusted by the number of ions applied at the time of ion beam irradiation. More preferably, the density of the through pores 21 is $1 \times 10^3$ to $1 \times 10^7$ pores/mm$^2$.

The porosity of the resin film 2 (the proportion of the sum of the cross-sectional areas of all the through pores 21 to the area defined by the outline of the resin film 2) is not particularly limited. In view of ensuring a film strength sufficient for the intended use, the porosity is preferably 50% or less, and more preferably 35% or less.

In addition, the thickness of the resin film 2 is not particularly limited. In order to realize a structure that has small pore diameters (high water pressure resistance) and a high porosity (high air permeability) (in order to form pores of small diameters even when a thick base material is used), the ratio of the thickness of the resin film 2 to the predetermined size (T/D when the predetermined size is defined as D and the thickness of the resin film is defined as T) is preferably 1 or more and 10000 or less, and more preferably 5 or more and 1000 or less.

The material of the resin film 2 is not particularly limited. Resins that can be decomposed by an alkali solution, an oxidant solution, or an alkali solution containing an oxidant are preferred. For example, the resin film 2 is made of at least one resin selected from polyethylene terephthalate (PET), polycarbonate (PC), polyimide (PI), polyethylene naphthalate (PEN), and polyvinylidene fluoride (PVdF).

An etching treatment liquid such as an alkali solution and an oxidant solution, which is appropriate for the material of the resin film 2, is used for the aforementioned etching for forming the through pores 21. For example, alkali solutions, such as potassium hydroxide and sodium hydroxide, can be used as a solution for hydrolyzing the resin. In addition, for example, oxidant solutions, such as a chlorous acid aqueous solution, a hypochlorous acid aqueous solution, a hydrogen peroxide solution, and a potassium permanganate solution, can be used as a solution for oxidatively decomposing the resin. For example, when the resin film 2 is formed of any of PET, PEN, and PC, a solution containing sodium hydroxide as the main component is used as the etching treatment liquid, and when the resin film 2 is formed of PI, a solution containing sodium hypochlorite as the main component is used as the etching treatment liquid. Furthermore, when the resin film 2 is formed of PVdF, a solution obtained by adding potassium permanganate to a solution containing sodium hydroxide as the main component is used as the etching treatment liquid to decompose PVdF.

Alternatively, a membrane filter sold by Oxyphen AG or Millipore Corporation can be used as the resin film 2 in which the through pores 21 are formed.

The resin film 2 may not necessarily consist of a single layer, and may consist of a plurality of separate layers.

In FIG. 1, the treated layer 3 is formed on one of both surfaces in the thickness direction of the resin film 2. However, the treated layer 3 may be formed on both surfaces of the resin film 2. That is, it is sufficient that the treated layer 3 is formed on at least one of both surfaces in the thickness direction of the resin film 2.

Specifically, the treated layer 3 is formed in such a manner as to have openings 31 at positions corresponding to the through pores 21, and has hydrophobicity and oil repellency. Such a treated layer 3 can be formed by applying a hydrophobic oil repellent agent thinly onto the resin film 2 and drying the agent. Examples of such an oil repellent agent include fluorine-based coating agents having a perfluoroalkyl group. The thickness of the treated layer 3 is preferably smaller than half of the above-described predetermined size of the through pores 21.

If an oil repellent agent is applied and dried on the resin film 2 in which the through pores 21 are formed as described above, the inner circumferential surfaces of the through pores 21 can also be coated with a second treated layer continuous with the treated layer 3. In this case, the sizes of the openings 31 of the treated layer 3 are smaller than the sizes of the through pores 21 by the thickness of the second treated layer.

The double-sided tape 4 is stuck to the edge region of the surface of the resin film 2 that is covered with the treated layer 3, with the treated layer 3 interposed therebetween. When the treated layer 3 is formed on both surfaces of the resin film 2, the double-sided tape 4 may be stuck to either surface of the resin film 2. That is, the double-sided tape 4 is stuck to the edge region of one of both surfaces in the thickness direction of the resin film 2, with the treated layer 3 interposed therebetween.

The double-sided tape 4 is produced by applying an adhesive to both surfaces of a base material. The base material and the adhesive are not particularly limited. For example, a non-woven fabric made of PET can be used as the base material, and an acrylic adhesive or a silicon-based adhesive can be used as the adhesive.

Figure 2:
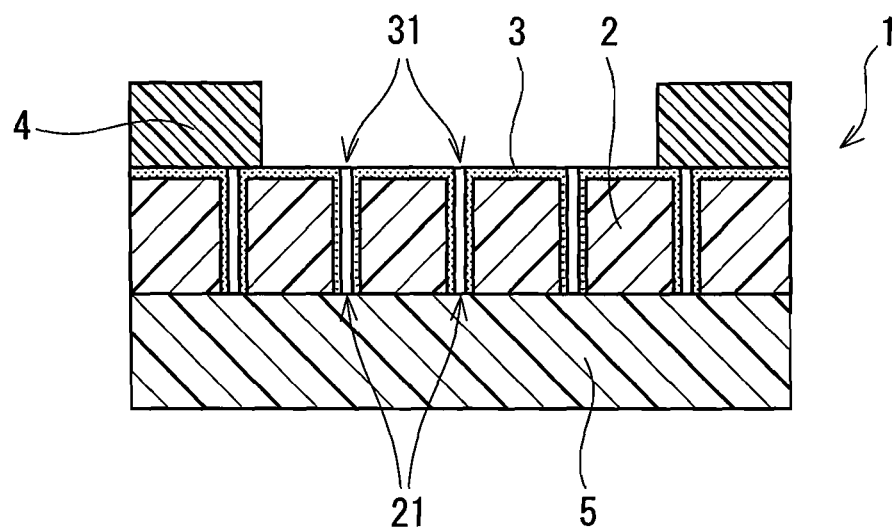
FIG. 2 is a schematic cross-sectional view of a water-proof air-permeable filter according to another embodiment of the present invention.

For example, as shown in FIG. 2, an air-permeable supporting member 5 may be laminated to the surface of the resin film 2 opposite to the surface to which the double-sided tape 4 is stuck. As shown in FIG. 2, the air-permeable supporting member 5 may be laminated directly on the resin film 2. Alternatively, when the treated layer 3 is formed on both surfaces in the thickness direction of the resin film 2, the air-permeable supporting member 5 may be laminated to the resin film 2 with the treated layer 3 interposed therebetween. The air-permeable supporting member 5 preferably has better air permeability than the resin film 2. For example, a woven fabric, a nonwoven fabric, a net, a mesh, or the like, can be used as the air-permeable supporting member 5. In addition, examples of the material of the air-permeable supporting member 5 include polyester, polyethylene, and aramid resins.

The resin film 2 and the air-permeable supporting member 5 are joined by a common method such as heat welding and bonding using an adhesive agent. The resin film 2 and the air-permeable supporting member 5 are partially joined, and the area of the joined parts is preferably 5 to 20% of the entire area. This is because when the area of the joined parts is less than 5% of the entire area, the resin film 2 and the air-permeable supporting member 5 are likely to separate from each other, whereas when the area of the joined parts is more than 20%, the water pressure resistance at the joined parts is reduced. Preferably, the joined parts are distributed evenly over the entire area.

When a water pressure resistance is measured in the same manner as in JIS L1092-A (low water pressure method) or JIS L1092-B (high water pressure method) after the water-proof air-permeable filter 1 having the above features is stuck to a metal plate (e.g., stainless steel plate) having an opening in such a manner as to cover the opening, the water pressure resistance is preferably 1 kPa or more and 1000 kPa or less.

In addition, when a measurement value is obtained by conducting measurement in the same manner as in JIS P8117 after the water-proof air-permeable filter 1 is stuck to a metal plate having an opening in such a manner as to cover the opening, and a Gurley number is obtained by converting the measurement value into a value per 642 mm$^2$, the Gurley number is preferably 0.5 seconds/100 mL or more and 500 seconds/100 mL or less.

The water-proof air-permeable filter 1 of the present embodiment allows ventilation by the through pores 21 formed in the resin film 2, and can also ensure waterproofness by the treated layer 3 on the resin film 2. Furthermore, since the non-porous resin film 2 is used, a large area of adhesion between the treated layer 3 formed on the resin film 2 and the double-sided tape 4 can be ensured. Therefore, in the water-proof air-permeable filter 1 of the present embodiment, the double-sided tape 4 and the treated layer 3 can be adhered to each other with a sufficient adhesion strength, and thus the double-sided tape 4 can be securely held.

In conventional water-proof air-permeable filters using PTFE porous membranes, a plurality of PTFE porous membranes are laminated in order to increase the thickness in some cases. In this case, water may leak from an interface between the PTFE porous membranes during pressure resistance test due to a pressure lower than the water pressure that each single PTFE porous membrane can withstand. By contrast, in the case of the water-proof air-permeable filter 1 of the present embodiment, it is sufficient to use a thick resin film 2 in order to increase the thickness. Accordingly, no problem occurs during water pressure resistance test. In order to form the through pores 21 in the thick resin film 2, it is sufficient to irradiate the resin film 2 with heavy ions at a high acceleration and a high density at the time of ion beam irradiation.

Furthermore, since PTFE porous membranes are made porous by stretching, a water-proof air-permeable filter using a PTFE porous membrane has a low tensile strength. By contrast, the water-proof air-permeable filter 1 of the present embodiment is not stretched, and thus has a high tensile strength. That is, according to the water-proof air-permeable filter 1 of the present embodiment, improvement in processability and resistance against external force can be expected.

In addition, with the features of the present embodiment, when the air-permeable supporting member 5 is used, the resin film 2 that is made of the same material as the air-permeable supporting member 5 can be used. Therefore, for example, the adhesion between the air-permeable supporting member 5 and the resin film 2 can be enhanced by improving compatibility at the time of thermal lamination.

EXAMPLES

Hereinafter, the present invention will be described in detail using examples. However, the present invention is not restricted by the examples to any degree.

Example 1

A sample A of 23 μm thickness (Oxydisk manufactured by Oxyphen AG), which is produced by forming through pores with a diameter of 0.4 μm in a non-porous base sheet of PET by means of ion beam irradiation and etching, was used as a resin film.

A nonwoven fabric made of PET was laminated as an air-permeable supporting member to one surface of the sample A which is a resin film by heat welding, and then a fluorine-based treatment agent (X-70-029C manufactured by Shin-Etsu Chemical Co., Ltd.) was applied to the other surface of the resin film and was dried, to form a treated layer having hydrophobicity and oil repellency. From the laminated body thus produced, a circular laminated body with a diameter of 10 mm was stamped out. Then, a ring-shaped double-sided tape which was produced by applying an acrylic adhesive to both surfaces of a base material of PET and which had an inner diameter of 5.5 mm and an outer diameter of 10 mm, was stuck to the edge region of the surface on the treated layer side of the stamped-out laminated body. In this manner, a water-proof air-permeable filter was obtained.

Example 2

A water-proof air-permeable filter was obtained in the same manner as in Example 1 except that a sample B of 22 μm thickness (Oxydisk manufactured by Oxyphen AG), which is produced by forming through pores with a diameter of 0.8 μm in a non-porous base sheet of PET by means of ion beam irradiation and etching, was used as a resin film.

Example 3

A water-proof air-permeable filter was obtained in the same manner as in Example 1 except that a sample C of 22 μm thickness (Oxydisk manufactured by Oxyphen AG), which is produced by forming through pores with a diameter of 1.0 μpm in a non-porous base sheet of PET by means of ion beam irradiation and etching, was used as a resin film.

Comparative Example 1

An adhesive sheet having no air permeability was obtained in the same manner as in Example 1 except that a non-porous film of PET having a thickness of 25 μm was used as a resin film.

Comparative Example 2

A water-proof air-permeable filter was obtained in the same manner as in Example 1 except that a PTFE porous membrane having a thickness of 15 µm and an average pore diameter of 0.8 µm was used instead of a resin film. The PTFE porous membrane was produced by firstly extruding and molding a mixture of PTFE fine powder and a liquid lubricant into a sheet shape, subsequently flattening the sheet-shaped molded body by pressure and drying the sheet-shaped molded body, and then stretching the sheet-shaped molded body by a factor of 4.5 in the longitudinal direction and by a factor of 15 in the lateral direction at 280° C. which is lower than or equal to the melting point of PTFE.

(Adhesive Force Measurement Test)

Figure 3:
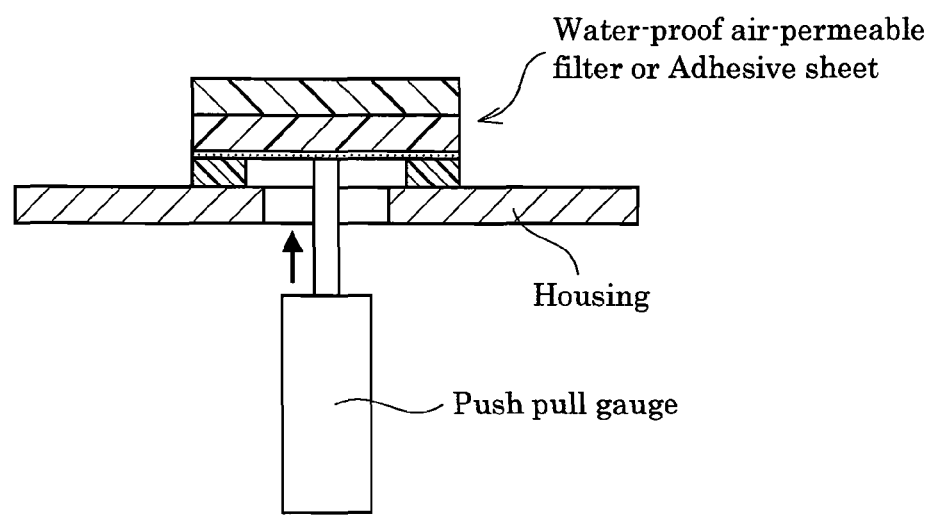
FIG. 3 is a diagram illustrating a method for measuring an adhesive force.

Adhesive force measurement test was conducted to measure the adhesive force of each of the water-proof air-permeable filters and the adhesive sheet of Examples and Comparative Examples which was stuck to a housing formed of a metal plate. First, as shown in FIG. 3, the water-proof air-permeable filter or the adhesive sheet was stuck to a housing having an opening with a diameter of 3 mm by means of the double-sided tape which was a component of the water-proof air-permeable filter or the adhesive sheet, such that the opening was covered from the inside of the housing, specifically, such that the treated layer faced the outside of the housing via the opening of the housing. The water-proof air-permeable filter or the adhesive sheet was stuck to the housing by placing the water-proof air-permeable filter or the adhesive sheet on the housing, and then moving a roll having a mass of 2 kg back and forth once over the water-proof air-permeable filter or the adhesive sheet at a speed of 5 mm/seconds.

Next, the water-proof air-permeable filter or the adhesive sheet stuck to the housing was subjected to aging for 30 minutes under a condition of a temperature of 25° C. and a relative humidity of 65%. Subsequently, a push pull gauge (9502 manufactured by Aikoh Engineering Co., Ltd.) having a terminal with a diameter of 1.1 mm was used, and the water-proof air-permeable filter or the adhesive sheet was pushed up from the outside of the housing by the terminal of the push pull gauge through the opening of the housing. A push-up force at the moment when the water-proof air-permeable filter or the adhesive sheet started to unstick was measured as an adhesive force. In addition, when the water-proof air-permeable filter or the adhesive sheet started to unstick, the part where breakage occurred was identified.

Furthermore, in order to check the durability, the adhesive force measurement was conducted also after the water-proof air-permeable filter or the adhesive sheet stuck to the housing was immersed in a hot water of 80° C. for 48 hours. The test results are shown in Table 1.

TABLE 1

| | Adhesive force (N) | | Part broken during |
| --- | --- | --- | --- |
| | Immediately after sticking | After hot water immersion | adhesive force measurement |
| Example 1 | 7.91 | 6.72 | Inside of double-sided tape |
| Example 2 | 8.25 | 7.17 | Inside of double-sided tape |
| Example 3 | 8.28 | 7.00 | Inside of double-sided tape |
| Com. Example 1 | 5.33 | 4.78 | Inside of double-sided tape and interface between treated layer and double-sided tape |

TABLE 1-continued

| | Adhesive force (N) | | Part broken during |
| --- | --- | --- | --- |
| | Immediately after sticking | After hot water immersion | adhesive force measurement |
| Com. Example 2 | 3.32 | 1.81 | Interface between treated layer and double-sided tape |

In Comparative Examples 1 and 2, breakage occurred at the interface between the double-sided tape and the treated layer. This shows that the strength of adhesion between the double-sided tape and the treated layer was low. By contrast, in Examples 1 to 3, breakage occurred inside the double-sided tape. From this result, it is understood that the strength of adhesion between the double-sided tape and the treated layer was high. In addition, in Comparative Example 2 for which a PTFE porous membrane was used, the adhesive force was reduced by about 45% after hot water immersion, while in Examples 1 to 3 for which resin films were used, the reduction of the adhesive force after hot water immersion was less than 16%, and the adhesive force was 5 N or more even after hot water immersion.

(Water Pressure Resistance Test and Gurley Test)

Next, water pressure resistance test and Gurley test were conducted for each of the water-proof air-permeable filters of Examples and Comparative Examples. First, the water-proof air-permeable filter was joined to the housing in the same manner as in the adhesive force test. Subsequently, water pressure is applied from the outside of the housing at 100 kPa/minute in the same manner as in JIS L1092B (high water pressure method), and the pressure at the moment when water started to leak from the water-proof air-permeable filter was measured as a water pressure resistance.

In the Gurley test, the housing to which each of the water-proof air-permeable filters was joined was set to a Gurley tester specified in JIS P8117, and the time required for 100 mL of air to pass through the water-proof air-permeable filter was measured. Subsequently, the measurement value was converted into a value per 642 mm$^2$ to calculate a Gurley number.

The results are shown in Table 2.

TABLE 2

| | Water pressure resistance (kPa) | Gurley number (sec/100 mL) |
| --- | --- | --- |
| Example 1 | 250 | 22.1 |
| Example 2 | 120 | 4.5 |
| Example 3 | 100 | 5.8 |
| Com. Example 2 | 95 | 6.9 |

It is understood from Table 2 that in Examples 1 to 3 for which resin films were used, both the water pressure resistance and the degree of air permeation are high.

Industrial Applicability

The water-proof air-permeable filter of the present invention is applicable to, for example, outdoor lamps such as outside lights, and lamps for electric trains etc., as well as automobile electric components, household electric appliances, and solar cells.

The invention claimed is:

1. A water-proof air-permeable filter for ensuring ventilation and also preventing entry of water, the water-proof air-permeable filter comprising:

a non-porous resin film having formed therein a plurality of through pores extending through the resin film in a thickness direction and each having a size larger than or equal to 0.01 μm and smaller than or equal to 10 μm;

a treated layer having hydrophobicity and oil repellency, and formed on at least one of both surfaces in the thickness direction of the resin film such that the treated layer has openings at positions corresponding to the plurality of through pores; and a tape stuck to an edge region of one of both surfaces in the thickness direction of the resin film, with the treated layer being interposed between the resin film and the tape, wherein the tape comprises a base material and an adhesive formed onto both surfaces of the base material, the treated layer coats an inner surface of the through pores so as to form an inner part of the treated layer located inside the through pores, and a material forming the treated layer is different from a material forming the resin film.

2. The water-proof air-permeable filter according to claim 1, wherein the plurality of through pores are uniformly distributed such that a density of the plurality of through pores falls in a range from 10 to $1\times10^8$ pores/mm$^2$.

3. The water-proof air-permeable filter according to claim 1, wherein a porosity of the resin film is 50% or less.

4. The water-proof air-permeable filter according to claim 1, wherein a ratio of a thickness of the resin film to the size of the through pores is 1 or more and 10000 or less.

5. The water-proof air-permeable filter according to claim 1, wherein the resin film is made of a resin that is decomposed with at least one solution selected from the group consisting of an alkali solution, an oxidant solution, and an alkali solution containing an oxidant.

6. The water-proof air-permeable filter according to claim 5, wherein the resin is at least one material selected from the group consisting of polyethylene terephthalate, polycarbonate, polyimide, polyethylene naphthalate, and polyvinylidene fluoride.

7. The water-proof air-permeable filter according to claim 1, further comprising an air-permeable supporting member laminated to a surface of the resin film opposite to the surface to which the tape is stuck.

8. The water-proof air-permeable filter according to claim 1, wherein an adhesive force of the water-proof air-permeable filter is 5N or higher, when the water-proof air-permeable filter is stuck to a housing formed of a metal plate.

9. The water-proof air-permeable filter according to claim 1, wherein when a water pressure resistance is measured according to JIS L1092-A, which provides a standard low water pressure method, or JIS L1092-B, which provides a standard high water pressure method, after the water-proof air-permeable filter is stuck to a metal plate having an opening so as to cover the opening of the metal plate, the water pressure resistance is 1 kPa or more and 1000 kPa or less.

10. The water-proof air-permeable filter according to claim 1, wherein a Gurley number of the water-proof air-permeable filter obtained according to JIS P8117 after the water-proof air-permeable filter is stuck to a metal plate having an opening so as to cover the opening of the metal plate is within 0.5 seconds/100 mL or more and 500 seconds/100 mL or less when converting a measured value to a value relative to an area having 642 mm$^2$.

11. A method of closing an opening of a housing, comprising applying the water-proof air-permeable filter according to claim 1 so as to cover the opening provided in the housing and to eliminate a pressure difference between inside of the housing and outside of the housing via the water-proof air-permeable filter.

12. The water-proof air-permeable filter according to claim 1, wherein the tape has a ring shape.

13. The water-proof air-permeable filter according to claim 1, wherein the non-porous resin film is made of at least one resin selected from the group consisting of polyethylene terephthalate, polyimide, and polyethylene naphthalate.

14. The water-proof air-permeable filter according to claim 13, wherein the treated layer is formed of a fluorine-based agent by applying the fluorine-based agent and drying the fluorine-based agent.

15. The water-proof air-permeable filter according to claim 1, wherein the through pores are straight pores extending linearly through the resin film when viewed in a cross-section of the resin film; and a size of the openings of the treated layer is smaller than a size of the respective through pore corresponding to a thickness of the inner part of the treated layer when viewed in the thickness direction of the resin film.

* * * * *